United States Patent
Min et al.

(10) Patent No.: US 7,898,850 B2
(45) Date of Patent: Mar. 1, 2011

(54) MEMORY CELLS, ELECTRONIC SYSTEMS, METHODS OF FORMING MEMORY CELLS, AND METHODS OF PROGRAMMING MEMORY CELLS

(75) Inventors: Kyu S. Min, San Jose, CA (US); Rhett T. Brewer, Santa Clara, CA (US); Tejas Krishnamohan, Palo Alto, CA (US); Thomas M. Graettinger, Boise, ID (US); D. V. Nirmal Ramaswamy, Boise, ID (US); Ronald A. Weimer, Boise, ID (US); Arup Bhattacharyya, Essex Junction, VT (US)

(73) Assignee: Micron Technology, Inc., Boise, ID (US)

(*) Notice: Subject to any disclaimer, the term of this patent is extended or adjusted under 35 U.S.C. 154(b) by 782 days.

(21) Appl. No.: 11/871,339

(22) Filed: Oct. 12, 2007

(65) Prior Publication Data

US 2009/0097320 A1  Apr. 16, 2009

(51) Int. Cl.
*G11C 11/34* (2006.01)

(52) U.S. Cl. ............... 365/185.03; 365/185.28; 977/943

(58) Field of Classification Search ........... 365/185.03, 365/185.28; 977/943
See application file for complete search history.

(56) References Cited

U.S. PATENT DOCUMENTS

| | | | |
|---|---|---|---|
| 4,870,470 A | 9/1989 | Bass, Jr. et al. | |
| 5,937,295 A * | 8/1999 | Chen et al. | 438/257 |
| 6,784,480 B2 | 8/2004 | Bhattacharyya | |
| 6,888,200 B2 | 5/2005 | Bhattacharyya | |
| 7,005,697 B2 | 2/2006 | Batra et al. | |
| 7,012,297 B2 | 3/2006 | Bhattacharyya | |
| 7,158,410 B2 | 1/2007 | Bhattacharyya et al. | |
| 7,166,888 B2 | 1/2007 | Bhattacharyya | |
| 7,209,389 B2 | 4/2007 | Lung | |

(Continued)

FOREIGN PATENT DOCUMENTS

EP   1480274 A2   11/2004

(Continued)

OTHER PUBLICATIONS

Ch. Sargentis, et al. "Deposition and Electrical Characterisation of a MOS Memory Structure Containing AU Nanoparticles in a High-K Dielectric Layer" Supplied by The British Library "The world's knowledge" © 2005 IEEE.

(Continued)

*Primary Examiner*—Alexander Sofocleous
(74) *Attorney, Agent, or Firm*—Wells St. John P.S.

(57) ABSTRACT

Some embodiments include memory cells having vertically-stacked charge-trapping zones spaced from one another by dielectric material. The dielectric material may comprise high-k material. One or more of the charge-trapping zones may comprise metallic material. Such metallic material may be present as a plurality of discrete isolated islands, such as nanodots. Some embodiments include methods of forming memory cells in which two charge-trapping zones are formed over tunnel dielectric, with the zones being vertically displaced relative to one another, and with the zone closest to the tunnel dielectric having deeper traps than the other zone. Some embodiments include electronic systems comprising memory cells. Some embodiments include methods of programming memory cells having vertically-stacked charge-trapping zones.

14 Claims, 10 Drawing Sheets

U.S. PATENT DOCUMENTS

| | | | |
|---|---|---|---|
| 7,250,653 B2 * | 7/2007 | Kim et al. | 257/324 |
| 7,393,745 B2 * | 7/2008 | Jeng | 438/257 |
| 7,759,715 B2 * | 7/2010 | Bhattacharyya | 257/296 |
| 2006/0110870 A1 | 5/2006 | Bhattacharyya | |
| 2006/0131633 A1 | 6/2006 | Bhattacharyya | |
| 2006/0192240 A1 | 8/2006 | Bhattacharyya | |
| 2006/0192243 A1 | 8/2006 | Bhattacharyya | |
| 2006/0202251 A1 | 9/2006 | Bhattacharyya | |
| 2006/0205132 A1 | 9/2006 | Bhattacharyya | |
| 2006/0258090 A1 | 11/2006 | Bhattacharyya et al. | |
| 2007/0034922 A1 | 2/2007 | Bhattacharyya | |
| 2007/0034930 A1 | 2/2007 | Bhattacharyya | |
| 2007/0045706 A1 | 3/2007 | Bhattacharyya | |
| 2007/0045711 A1 | 3/2007 | Bhattacharyya | |
| 2007/0045718 A1 | 3/2007 | Bhattacharyya | |
| 2007/0045719 A1 * | 3/2007 | Wang et al. | 257/324 |
| 2007/0048926 A1 * | 3/2007 | Ahn et al. | 438/216 |
| 2007/0052011 A1 | 3/2007 | Bhattacharyya | |
| 2007/0132010 A1 | 6/2007 | Bhattacharyya | |
| 2008/0057690 A1 | 3/2008 | Forbes et al. | |
| 2008/0121962 A1 | 5/2008 | Forbes et al. | |
| 2008/0268605 A1 | 10/2008 | Ahn et al. | |

FOREIGN PATENT DOCUMENTS

| | | |
|---|---|---|
| JP | 2004-349705 A | 12/2004 |
| KR | 10-2007-0014593 | 2/2007 |
| WO | PCT/US2008/077383 | 4/2009 |
| WO | PCT/US2008/077383 | 4/2010 |

OTHER PUBLICATIONS

Jong Jin Lee, et al. "Dielectric Engineering in Nanocrystal Memory Devices for Improved Programming Dynamics" IEEE, Physics Symposium, San Jose 2005.

Xuguang Wang, et al. "A Novel MONOS-Type Nonvolatile Memory Using High-K Dielectrics for Improved Data Retention and Programming Speed" IEEE Transactions on Electron Devices, vol. 51, No. 4 Apr. 2004 pp. 597-602.

Jan Van Houdt "High -K Materials for Nonvolatile Memory Applications" IEEE, Physics Symposium, San Jose 2005 pp. 234-239.

Josef Willer, et al. "110 nm NROM Technology for Code and Data Flash Products" Jul. 2004 Symposium on VLSI Technology Digest of Technical Papers pp. 76-77.

Sandip Tiwari, et al. "Volatile and Non-Volatile Memories in Silicon with Nano-Crystal Storage" IEEE © 1995 IEDM 95-521 through IEDM 95-524.

S. Okhonin, et al. "A SOI Capacitor-less 1T-DRAM Concept" 2001 IEEE International SOI Conference Jan. 2001, pp. 153-154.

Takashi Ohsawa, et al. "Memory Design Using One-Transistor Gain Cell on SOI" ISSCC Feb. 5, 2002/Session 9/DRAM and Ferroelectric Memories/9.1.

Shieun Kim, et al. "Robust Multi-bit Programmable Flash Memory Using A Resonant Tunnel Barrier" IEEE © Aug. 2005.

S. Lombardo, et al. "Distribution of the Threshold Voltage Window in Nanocrystal Memories with Si Dots Formed by Chemical Vapor Deposition: Effect of Partial Self-Ordering" reprinted Jun. 6, 2007.

T.C. Chang, et al. "Quasisuperlattice storage: A concept of multilevel charge storage" American Institute of Physics, Applied Physics Letters, vol. 85, No. 2, Jul. 12, 2004 pp. 248-250.

Jiun-Yi Tseng, et al. "Memory characteristics of Pt nanocrystals self-assembled from reduction of an embedded $PtO_x$ ultrathin film in metal-oxide-semiconductor structures" American Institute of Physics, Applied Physics Letters, vol. 85, No. 13, Sep. 27, 2004, pp. 2595-2597.

Seung-Hyun Lim, et al. "Nonvolatile MOSFET memory based on high density WN nanocrystal layer fabricated by novel PNL (Pulsed Nucleation Layer) method" 2005 Symposium on VLSI Technology Digest of Technical Papers, pp. 190-191.

S.K. Samanta, et al. "Enhancement of Memory Window in Short Channel Non-Volatile Memory Devices Using Double Layer Tungsten Nanocrystals" IEEE © 2005, 4 pages.

K.W. Guarini, et al. "Low voltage, scalable nanocrystal Flash memory fabricated by templated self assembly" IEEE, © 2003, IEDM 03-541 through IEDM 03-544.

Shan Tang, et al. "Nanocrystal Flash Memory Fabricated with Protein-mediated Assembly" Microelectronics Research Center, The University of Texas at Austin. Downloaded Jun. 4, 2007, 4 pages.

Konstantin K. Likharev "Riding the Crest of a New Wave in Memory" NOVORAM: A New Concept for Fast, Bit-Addressable Nonvolatile Memory Based on Crested Barriers Circuits & Devices, Jul. 2000, pp. 16-21.

B. Govoreanu, et al. "A Figure of Merit for Flash Memory Multi-Layer Tunnel Dielectrics" pp. 270-273 reprinted Jun. 6, 2007.

B. Govoreanu, et al. "VARIOT: A Novel Multilayer Tunnel Barrier Concept for Low-Voltage Nonvolatile Memory Devices" IEEE Electron Device Letters, vol. 24, No. 2, Feb. 2003 pp. 99-101.

Jing Hao Chen, "Nonvolatile Flash Memory Device Using Ge Nanocrystals Embedded in HfAlO High-K Tunneling and Control Oxides: Device Fabrication and Electrical Performance" IEEE Transactions on Electron Devices, vol. 51, No. 11, Nov. 2004, pp. 1840-1848.

Rohit Gupta, et al. "Formation of SiGe nanocrystals in $HfO_2$ using in situ chemical vapor deposition for memory applications" Applied Physics Letters, vol. 84, No. 21, May 24, 2004, pp. 4331-4333.

C. Monzio, et al. "Study of data retention for nanocrystal Flash memories" Physics Symposium, Dallas, Texas, 2003, pp. 506-512.

Chungho Lee, et al. "Operational and Reliability Comparison of Discrete-Storage Nonvolatile Memories: Advantages of Single- and Double-Layer Metal Nanocrystals" IEDM 03-557 through IEDM 03-560 May 2003.

M Takata, et al. "New Non-Volatile Memory with Extremely High Density Metal Nano-Dots" IEEE © May 2003, IEDM 03-553 through IEDM 03-556.

Mitsu Koyanagi, et al. "Metal Nano-Dot Memory for High-Density Non-Volatile Memory Application" IEEE © 2004, pp. 885-889.

Chungho Lee, et al. "Metal nanocrystal/nitride heterogeneous-stack floating gate memory" IEEE © 2005 pp. 97-98.

Min She, et al. "Improved SONOS-type Flash Memory using $HfO_2$ as Trapping Layer" Department of Electrical Engineering and Computer Sciences, UC Berkley http://www.eecs.berkeley.edu/~takeuchi/paper/HfO2_memory.pdf.

* cited by examiner

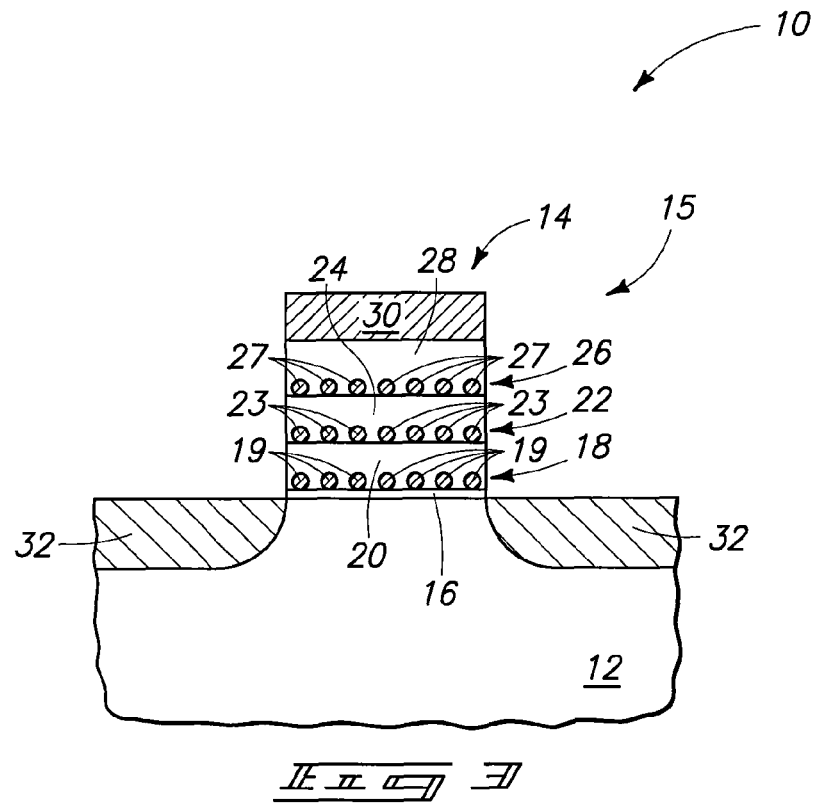
_Fig 3_
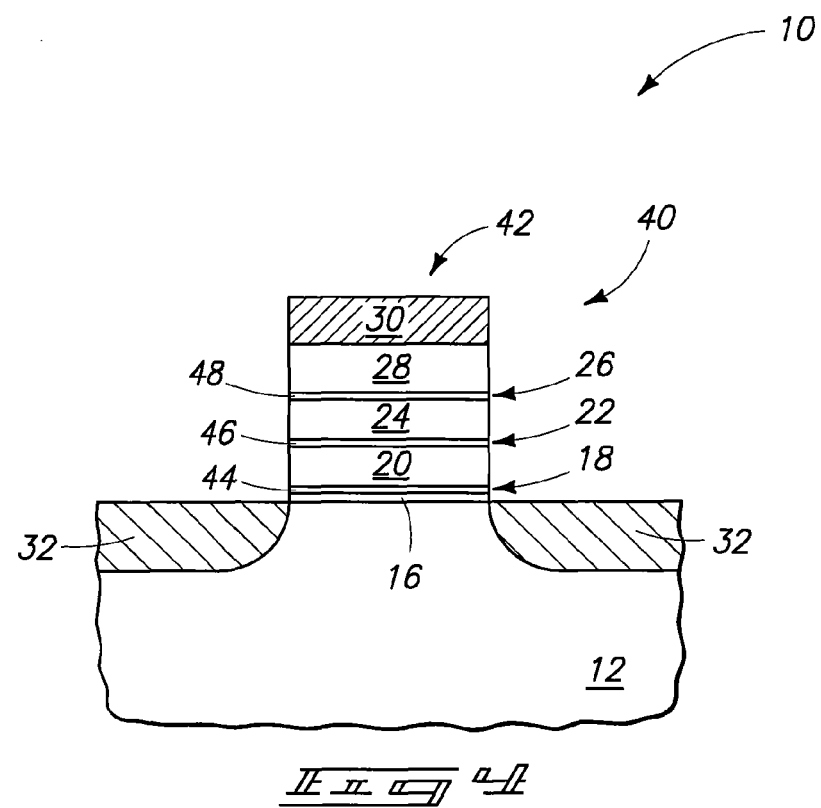
_Fig 4_

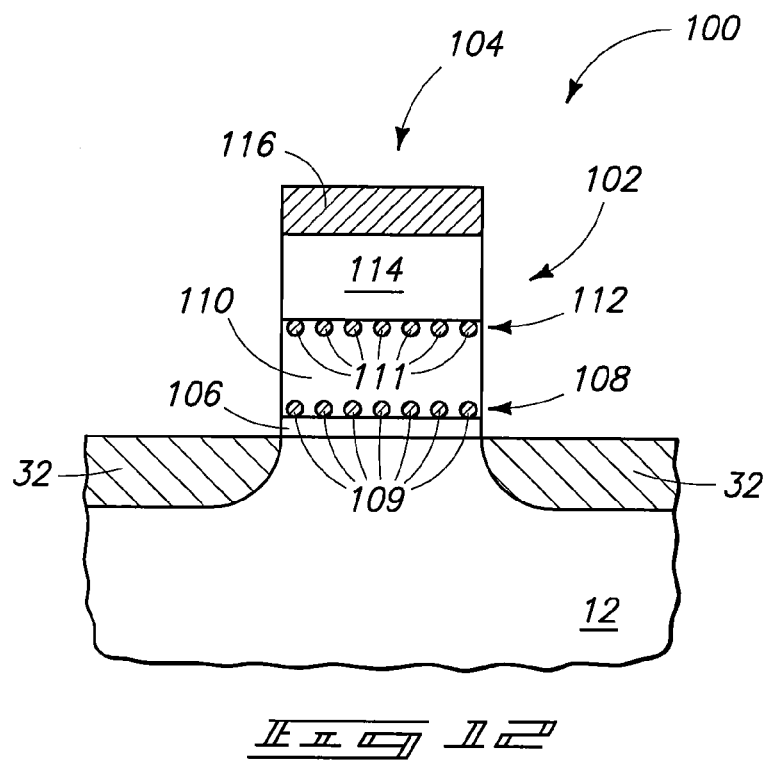
_Fig. 12_
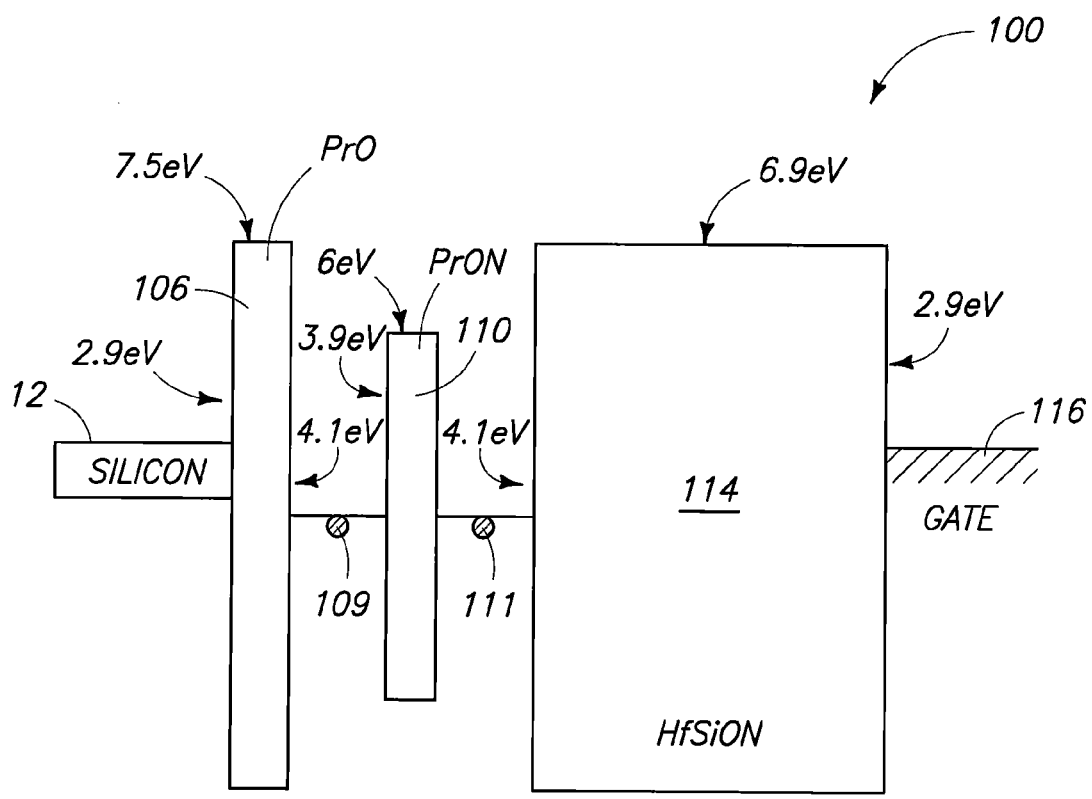
_Fig. 13_

MEMORY CELLS, ELECTRONIC SYSTEMS, METHODS OF FORMING MEMORY CELLS, AND METHODS OF PROGRAMMING MEMORY CELLS

TECHNICAL FIELD

Memory cells, electronic systems, methods of forming memory cells, and methods of programming memory cells.

BACKGROUND

Memory devices provide data storage for electronic systems. One type of memory is a non-volatile memory known as flash memory. A flash memory is a type of EEPROM (electrically-erasable programmable read-only memory) that may be erased and reprogrammed in blocks. Many modern personal computers have BIOS stored on a flash memory chip. Such a BIOS is sometimes called a flash BIOS. Flash memory is also popular in wireless electronic devices because it enables the manufacturer to support new communication protocols as they become standardized, and to provide the ability to remotely upgrade the device for enhanced features.

A typical flash memory comprises a memory array that includes a large number of non-volatile memory cells arranged in row and column fashion. The cells are usually grouped into blocks. Each of the cells within a block may be electrically programmed by charging a floating gate. The charge may be removed from the floating gate by a block erase operation. Data is stored in a cell as charge in the floating gate.

NAND is a basic architecture of flash memory. A NAND cell unit comprises at least one select gate coupled in series to a serial combination of memory cells (with the serial combination being commonly referred to as a NAND string). The gates of the NAND string have traditionally been single level cells (SLCs), but manufacturers are transitioning to utilization of multilevel cells (MLCs) for gates of NAND strings. An SLC stores only one data bit, whereas an MLC stores multiple data bits. Accordingly, memory array density can be at least doubled by transitioning from SLCs to MLCs.

MLCs differ from SLCs in the programming of the devices. Specifically, a device may be programmed as an SLC if the device is programmed to have only two memory states (0 or 1), with one of the memory states corresponding to one level of stored charge at a floating gate (for example, corresponding to the fully charged device) and the other corresponding to another level of stored charge at the floating gate (for example, corresponding to the fully discharged device). Alternatively, the device may be programmed as an MLC having two bits of memory if the device is programmed to have four memory states. The memory states may be designated as the 11, 01, 00, and 10 memory states, in order from lowest stored charge (for example, fully discharged) to highest stored charge (for example, fully charged). Accordingly, the 11 state corresponds to a lowest stored charge state, the 10 state corresponds to a highest stored charge state, and the 01 and 00 states correspond to, for example, first and second intermediate levels of stored charge.

Regardless of whether devices are utilized as MLCs or SLCs, there are continuing goals to avoid parasitic capacitive coupling effects and stress-induced gate leakage, and to have a large memory window (with a memory window being the charge window that enables a non-volatile cell to be charged, and being defined by how much charge is placed on the cell within a given time). A large memory window may enable the multiple memory states of an MLC device to be clearly separated from one another.

Charge-trapping materials, such as, for example, metallic charge traps (MCTs) show promise for utilization in non-volatile memory cells, but difficulties are presented in obtaining large memory windows, good retention of charge by non-volatile devices, and uniformity across numerous devices of a NAND array (in other words, avoiding cell-to-cell sigma variation).

It is desired to develop structures and fabrication processes by which to alleviate or overcome one or more of the above-discussed difficulties and/or to achieve one or more of the above-discussed goals.

BRIEF DESCRIPTION OF THE DRAWINGS

FIG. 3 is a diagrammatic cross-sectional view of a portion of a semiconductor wafer illustrating an embodiment of a memory cell.

FIG. 4 is a diagrammatic cross-sectional view of a portion of a semiconductor wafer illustrating another embodiment of a memory cell.

FIG. 12 is a diagrammatic cross-sectional view of a portion of a semiconductor wafer illustrating another embodiment of a memory cell.

FIG. 13 is an energy band diagram of an example of the embodiment of FIG. 12.

DETAILED DESCRIPTION OF THE ILLUSTRATED EMBODIMENTS

Figure 1:
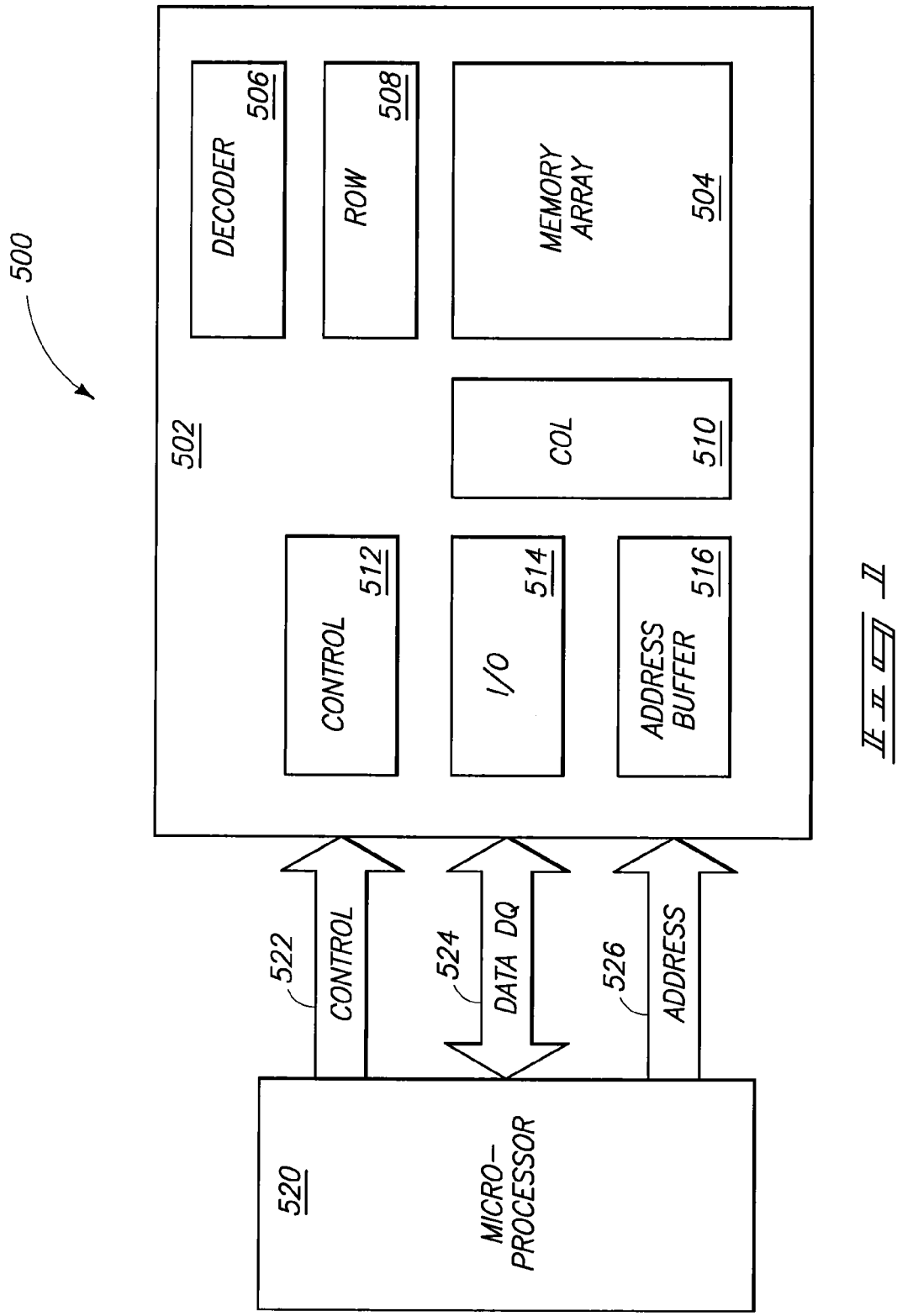
FIG. 1 is a simplified block diagram of a memory system in accordance with an embodiment.

FIG. 1 is a simplified block diagram of a memory system 500, according to an embodiment. Memory system 500 includes an integrated circuit flash memory device 502 (e.g., a NAND memory device), that includes an array of floating-gate memory cells 504, an address decoder 506, row access circuitry 508, column access circuitry 510, control circuitry 512, input/output (I/O) circuitry 514, and an address buffer 516. Memory system 500 includes an external microprocessor 520, or other memory controller, electrically connected to memory device 502 for memory accessing as part of an electronic system. The memory device 502 receives control signals from the processor 520 over a control link 522. The memory cells are used to store data that is accessed via a data (DQ) link 524. Address signals are received via an address link 526, and are decoded at address decoder 506 to access the memory array 504. Address buffer circuit 516 latches the address signals. The memory cells may be accessed in response to the control signals and the address signals.

Figure 2:
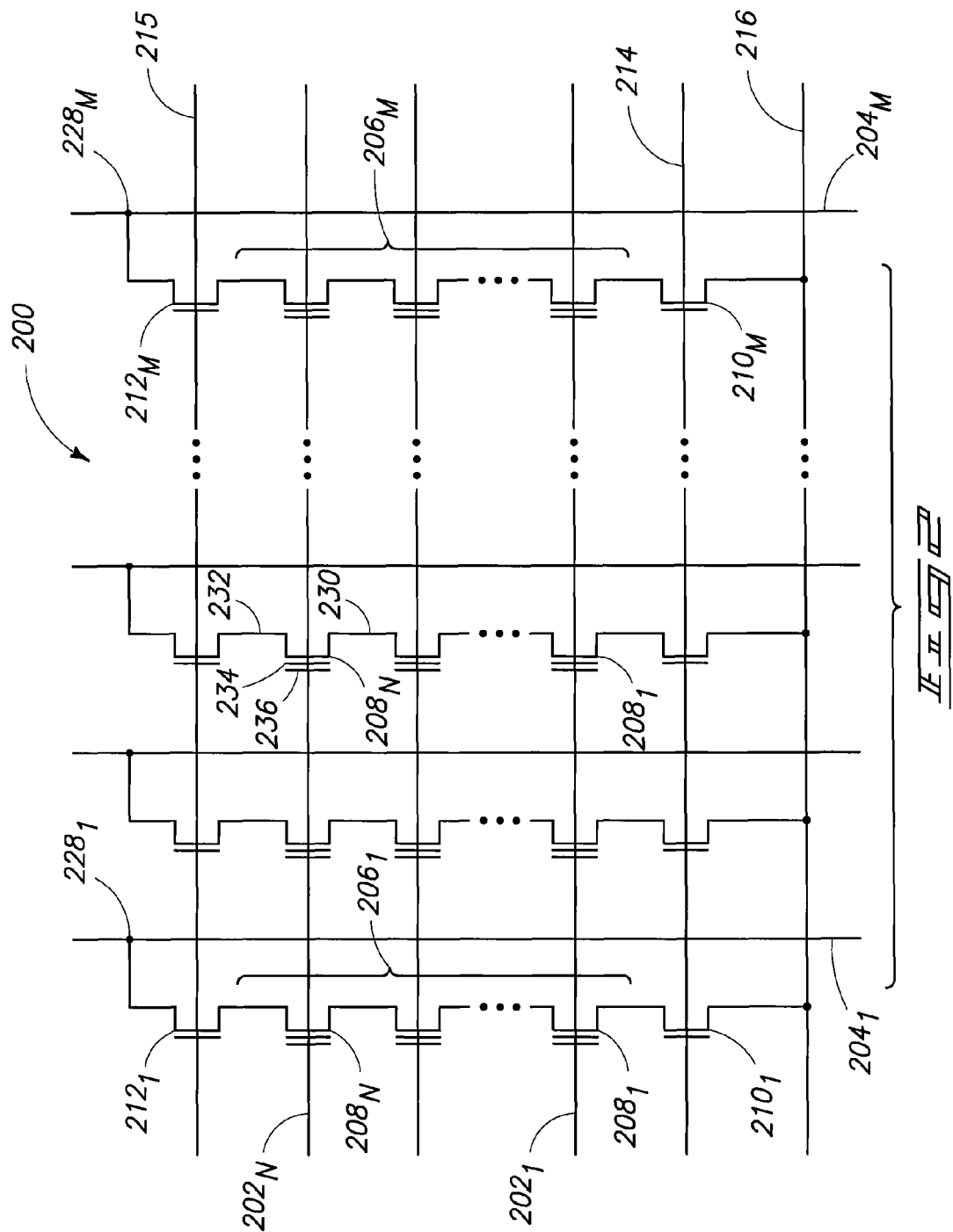
FIG. 2 is a schematic of a NAND memory array in accordance with an embodiment.

FIG. 2 is a schematic of a NAND memory array 200. Such may be a portion of memory array 504 of FIG. 1. Memory array 200 includes wordlines $202_1$ to $202_N$, and intersecting local bitlines $204_1$ to $204_M$. The number of wordlines 202 and the number of bitlines 204 may be each some power of two, for example, 256 wordlines and 4,096 bitlines. The local bitlines 204 may be coupled to global bitlines (not shown) in a many-to-one relationship.

Memory array 200 includes NAND strings $206_1$ to $206_M$. Each NAND string includes floating gate transistors $208_1$ to $208_N$. The floating gate transistors are located at intersections of wordlines 202 and local bitlines 204. The floating gate transistors 208 represent non-volatile memory cells for storage of data. The floating gate transistors 208 of each NAND string 206 are connected in series source to drain between a source select gate 210 and a drain select gate 212. Each source select gate 210 is located at an intersection of a local bitline 204 and a source select line 214, while each drain select gate 212 is located at an intersection of a local bitline 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. The source select gates 210 are connected to source select line 214.

The drain of each drain select gate 212 is connected to a local bitline 204 for the corresponding NAND string at a drain contact 228. For example, the drain of drain select gate $212_1$ is connected to the local bitline $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating gate transistor $208_N$ of the corresponding NAND string $206_1$.

Floating gate transistors 208 include a source 230 and a drain 232, a floating gate 234, and a control gate 236. Floating gate transistors 208 have their control gates 236 coupled to a wordline 202. A column of the floating gate transistors 208 are those NAND strings 206 coupled to a given local bitline 204. A row of the floating gate transistors 208 are those transistors commonly coupled to a given wordline 202.

In some embodiments, a non-volatile memory cell comprises a vertical stack of charge-trapping zones, with the individual zones being separated from one another by dielectric material.

The individual charge-trapping zones may comprise one or more layers of charge-trapping material, and in some embodiments may comprise metallic material. The metallic material may be formed as a contiguous layer, or may be formed as discrete isolated islands. In some embodiments, at least some of the islands may be nanoparticles, with nanoparticles being understood to be structures less than or equal to about 1000 nanometers along a maximal cross-section, and frequently less than 10 nanometers, or even less than 3 nanometers along a cross-section. In some embodiments, the nanoparticles may have maximal cross-sectional dimensions of from about 1 nanometer to about 100 nanometers. The nanoparticles may be configured to trap less than or equal to about 20 charges, and may, for example, be configured to trap from about one charge to about 20 charges. The nanoparticles may be substantially spherical, and in such embodiments may be referred to as nanodots.

At least some of the dielectric material separating the charge-trapping zones from one another may be high-k dielectric material (with "high-k" dielectric material being material having a dielectric constant greater than that of silicon dioxide). In some embodiments, some of the high-k dielectric material is a charge-trapping material (such as silicon nitride), while in other embodiments an entirety of the high-k dielectric material is not charge-trapping material. The high-k dielectric material may, for example, consist of various oxides and/or oxynitrides (with "oxides" including aluminates and silicates). For instance, the high-k material may comprise one or more oxides or oxynitrides comprising one or more of aluminum, zirconium and hafnium. As another example, the high-k material may comprise one or more oxides or oxynitrides of one or more lanthanides (with the term "lanthanide" referring to any of the elements having atomic number 57-71; and specifically any of La, Ce, Pr, Nd, Pm, Sm, Eu, Gd, Tb, Dy, Ho, Er, Tm, Yb, and Lu).

In some embodiments, only some of the dielectric material separating the charge-trapping zones from one another is high-k dielectric material, and the remaining dielectric material may include any suitable composition, such as silicon dioxide.

An example embodiment of a memory cell comprising vertically-stacked charge-trapping zones is illustrated in FIG. 3 as a non-volatile memory cell 15 that is part of a semiconductor construction 10.

The semiconductor construction comprises a base 12. Base 12 may, for example, comprise, consist essentially of, or consist of monocrystalline silicon lightly-doped with background p-type dopant, and may be referred to as a semiconductor substrate, or as a portion of a semiconductor substrate. The terms "semiconductive substrate" and "semiconductor substrate" are defined to mean any construction comprising semiconductive material (for instance silicon and/or germanium), including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A gate stack 14 is supported by base 12. The gate stack includes a tunnel dielectric 16, a first charge-trapping zone 18, a first body dielectric material 20 over the first charge-trapping zone, a second charge-trapping zone 22, a second body dielectric material 24 over the second charge-trapping zone, a third charge-trapping zone 26, a blocking dielectric material 28 over the third charge-trapping zone, and a control gate 30 over the blocking dielectric material.

The shown embodiment comprises three vertically-stacked charge-trapping zones (18, 22 and 26). Other embodiments may have more or less than three vertically-stacked charge-trapping zones. In example embodiments of non-volatile memory cells for NAND memory arrays, there may be from two vertically-stacked charge-trapping zones to five vertically-stacked charge-trapping zones.

Each of the shown charge-trapping zones comprises a plurality of discrete islands of charge-trapping material (the islands are labeled 19, 23 and 27 in zones 18, 22 and 26, respectively). The islands are illustrated to comprise electrically conductive material, such as metal, but in other embodiments at least some of the islands may comprise charge-trapping dielectric material. The islands may correspond to nanoparticles (such as, for example, nanodots) in some embodiments. The charge-trapping material may comprise metal, conductively-doped semiconductor material (for instance, conductively-doped silicon or germanium), metal-doped regions in a dielectric, and/or silicon nitride. An advantage of utilizing metal and/or semiconductor material is that such are programmed and erased primarily with electrons; in contrast to silicon nitride which is programmed with electrons but erased with holes. The erasure with holes can damage the silicon nitride, and damage other materials through which the holes pass.

If the charge-trapping islands comprise metal-containing material, such material may be in any suitable form, and may, for example, correspond to metal clusters, metal nanocrystals, doped metal-containing compositions, and/or metal-doped compositions. In some embodiments, the charge-trapping islands may comprise, consist essentially of, or consist of one or more of Au, Ag, Co, Ge, Ir, Ni, Pd, Pt, Re, Ru, Si, Ta, Te, Ti and W.

The charge-trapping materials of zones 18, 22 and 26 may be the same as one another or different. In some embodiments, the charge-trapping materials within one zone differ from those within another zone in one or more of size, distribution, composition, density (with density referring to a population density of nanoparticles, and specifically to the number of nanoparticles per unit area), and trapping energy (with trapping energy referring to the potential energy depth of the traps). In some embodiments, the differences between the charge-trapping materials within the various charge-trapping zones may, together with the differences in distances of the various zones from the tunnel dielectric, enable the zones to behave substantially differently from one another during programming of the non-volatile memory device. In other embodiments, the differences between the charge-trapping materials within the various charge-trapping zones may enable the zones to behave similarly to one another during programming of the non-volatile memory device in spite of the different distances of the zones from the tunnel dielectric 16.

In some embodiments, the charge traps within the zone closest to the tunnel dielectric 16 (the charge traps within zone 18 in the shown embodiment) may be relatively deep compared to the charge traps in the other zones; the charge traps within the zone furthest from the tunnel dielectric (the charge traps within zone 26 in the shown embodiment) may be relatively shallow compared to charge traps in the other zones; and the charge traps in the zone of intermediate distance from the tunnel dielectric (the charge traps within zone 22 in the shown embodiment) may be of intermediate depth compared to the other zones. Such may render the zones roughly equivalent to one another during programming of the non-volatile memory cell; and specifically may enable injection of charge to the various zones and/or displacement of charge from the various zones to be roughly comparable to one another in spite of the differing distances of the zones from the tunnel dielectric.

The body dielectric materials 20 and 24 may comprise any suitable compositions or combination of compositions, and may be the same as one another or different. In some embodiments, at least one of the dielectric materials 20 and 24 will comprise high-k dielectric material. At least a portion of the high-k dielectric material may be charge-trapping material, such as silicon nitride; and the high-k dielectric material may thus supplement the charge-trapping characteristics of the charge-trapping zones. The charge-trapping dielectric may further assist in carrier transport during program and erase between different charge-trapping zones for access to the full memory stack by electrons and holes.

In other embodiments, at least one of the dielectric materials 20 and 24 will consist of high-k dielectric material that is not charge trapping. In some embodiments, the body dielectric material directly over the charge-trapping zone closest to the tunnel dielectric (the body dielectric material 20 in the shown embodiment) will consist of high-k dielectric material that is not charge trapping. For instance, such dielectric material may consist of one or more oxides selected from the group consisting of lanthanide oxides, $HfO_2$, $Al_2O_3$, $HfAl_xO_y$, $HfSi_pO_q$, $ZrO_2$ and mixtures thereof; where x, y, p and q are greater than zero. Alternatively, or additionally, at least one of the dielectric materials 20 and 24 may consist of a lanthanide oxynitride, such as, for example, PrON (shown in terms of the constituent elements, rather than in terms of a stoichiometry). The PrON may comprise about 40 atom percent Pr, from about 10 atom percent to about 20 atom percent O, and from about 30 atom percent to about 50 atom percent N. For instance, the PrON may comprise about 40 atom percent Pr, about 20 atom percent O, and about 40 atom percent N. Alternatively, or additionally, such high-k dielectric material may also comprise lanthanide silicate (i.e., may comprise lanthanide, silicon and oxygen), or lanthanide aluminate (i.e., may comprise lanthanide, aluminum and oxygen).

The body dielectric materials may additionally, or alternatively, comprise dielectric material that is not high-k, and may, for example, comprise, consist essentially of, or consist of silicon dioxide. However, utilization of high-k dielectric material may enable the dielectric material to be tuned to specific desired performance characteristics.

The body dielectric materials may be formed to thicknesses of from about 0.5 nanometer to about 30 nanometers. In some embodiments, the body dielectric materials may be formed to thicknesses from about one nanometer to about 10 nanometers of effective silicon dioxide thickness (with the term "effective silicon dioxide thickness" meaning a thickness having the equivalent dielectric capacitance as the stated thickness of silicon dioxide); and in some embodiments may be formed to from about one nanometer to about three nanometers of effective silicon dioxide thickness.

In some embodiments, the materials 20 and 24 may be considered spacing materials, in that they space vertically-displaced charge trapping zones from one another. At least one of the spacing materials may include one or more of one or more of silicon nitride, lanthanide oxides, lanthanide oxynitrides, hafnium oxide, aluminum oxide, hafnium aluminum oxide, hafnium silicate, hafnium silicon oxynitride, silicon dioxide, zirconium silicon oxynitride, zirconium aluminate, zirconium silicate, zirconium oxide, lanthanide silicate and lanthanide aluminate.

The tunnel dielectric material 16 may comprise any suitable composition or combination of compositions, and may, for example, comprise, consist essentially of, or consist of one or more of silicon dioxide and various lanthanide oxides. The tunnel dielectric material may be formed to an equivalent silicon dioxide thickness of from about 1 nanometer to about 7 nanometers.

The blocking dielectric material 28 may comprise any of the compositions discussed above for the body dielectric materials 20 and 24. Accordingly, the blocking dielectric material may comprise any of various high-k dielectric compositions, including, for example, one or more of aluminum oxide, hafnium silicon oxynitride (HfSiON—which is shown in terms of constituent elements rather than stoichiometry), hafnium oxide, lanthanide silicate and lanthanide aluminate. The blocking dielectric material will typically have a higher dielectric constant than the tunnel dielectric material. The blocking dielectric material may be formed to an effective silicon dioxide thickness of from about 0.5 nanometers to about 10 nanometers.

The control gate 30 may comprise any suitable composition or combination of compositions. For instance, the control gate may comprise one or more of various metals (for instance, tungsten, titanium, etc.), metal-containing compositions (for instance, metal silicides, metal nitride, etc.) and conductively-doped semiconductor materials (for instance, conductively-doped silicon, etc.). In some embodiments, the control gate may comprise a metal nitride passivation layer directly against the blocking dielectric material, and may comprise doped semiconductor material over the metal nitride passivation layer. The metal nitride passivation may block dopant from passing from the doped semiconductor material to the blocking dielectric. The metal nitride passivation layer may comprise, for example, titanium nitride or tantalum nitride.

A pair of source/drain regions 32 are formed on opposing sides of gate stack 14. In the shown embodiment, the source/drain regions are conductively-doped regions of the semiconductor material of base 12. Regions 32 may be either n-type or p-type majority doped.

The non-volatile memory cell 15 of FIG. 3 may be utilized as an SLC device or an MLC device.

In some embodiments, the various charge-trapping zones 18, 22 and 26 are together programmed and erased as a single charge-trapping unit. Specifically, the combination of body dielectric materials and charge-trapping materials may be tailored so that the zones are all charged to an appropriate desired potential. For instance, part of the tailoring may include utilization of charge-trapping materials within the various zones such that charge trapping depths across the various zones 18, 22 and 26 compensate for the differing distances of the zones from the tunnel dielectric material. Electrons are injected into the vertically-stacked charge-trapping zones during programming of the memory cell 15. The electrons that pass between islands 19 of zone 18 may be gathered by charge-trapping material within zones 22 and 24. This can increase the memory window of memory cell 15 relative to cells containing a single charge-trapping layer, in that more electrons may be gathered by the various vertically-stacked charge-trapping layers of memory cell 15 than would be gathered by a single charge-trapping layer. The additional charge-trapping layers of memory cell 15 may also improve charge retention relative to memory cells having only a single charge-trapping layer. Such improvement may be due, at least in part, to higher charge retention capacity In other embodiments, the various charge-trapping zones 18, 22 and 26 may be subjected to different programming voltages relative to one another, and may be programmed independently so that the physically separate charge-trapping zones correspond to different memory states of an MLC device. The MLC device is initially provided to be in a first memory state. The first memory state may correspond to state in which zones 18, 22 and 24 are not charged, or may correspond to a state in which one or more zones carries some charge, but in which the zones are not fully charged. A programming voltage is applied at a first level at which charge is injected primarily to only one of the three charge-trapping zones (for instance, the lowest programming level may correspond to the physically lower charge-trapping zone 18), and such layer becomes charged to lift a programming state of the cell from the first memory state to a second memory state. The programming voltage may then be increased to a level sufficient to charge only two of the three charge-trapping zones (for instance, the lower two programming levels may correspond to the physically lower two charge-trapping zones 18 and 22) to lift a programming state of the memory cell from the second memory state to a third memory state. Finally, the programming voltage may be increased to a level sufficient to charge all three of the charge-trapping zones, and to thereby lift a programming state of the memory cell from the third memory state to a fourth memory state.

In some embodiments, the above-described MLC programming may be utilized to program various memory cells of a memory array to different memory states relative to one another. The programming of the memory cells to a higher memory state may proceed sequentially through the lower memory states, as described above, or alternatively, the programming voltage may be initially provided at a sufficient voltage to obtain a higher memory state in a single programming step. In embodiments in which a plurality of memory cells of a memory array are programmed, the non-volatile memory cell 15 may be considered an example of one of a large number of identical cells incorporated into the memory array. The programming of the array may comprise leaving one set of the cells in the first memory state, programming another set of the cells to the second memory state, programming another set of the cells to the third memory state, and programming yet another set of the cells to the fourth memory state.

FIG. 3 shows one embodiment of a non-volatile memory cell having vertically-stacked charge-trapping zones (which might otherwise be referred to as layers). Another embodiment is shown in FIG. 4. In referring to FIG. 4, similar numbering will be used as is utilized above in describing FIG. 3, where appropriate.

FIG. 4 shows a semiconductor construction 10 comprising a non-volatile memory cell 40. The memory cell 40 comprises a gate stack 42 over base 12.

The gate stack 42 comprises tunnel dielectric material 16, first charge-trapping zone 18, body dielectric material 20, second charge-trapping zone 22, second body dielectric material 24, third charge-trapping zone 26, blocking dielectric material 28, and control gate 30.

The charge-trapping zones 18, 22 and 26 comprise layers 44, 46 and 48, respectively. Such layers may comprise any suitable compositions or combinations of compositions, and accordingly may comprise, consist essentially of, or consist of one or more of silicon nitride and various metals (for instance, metals selected from the group consisting of platinum, ruthenium, titanium and nickel). The charge-trapping layers of FIG. 4 are contiguous across the gate in the shown cross-section of FIG. 4, in contrast to the discontinuous charge-trapping layers of FIG. 3.

The charge-trapping layers of FIG. 4 may be programmed identically to the programming discussed above with reference to FIG. 3.

In some embodiments, non-volatile memory cells may be formed having vertically-stacked charge-trapping layers with one or more of such charge-trapping layers corresponding to discontinuous layers of the type shown in FIG. 3, and one or more of the charge-trapping layers corresponding to contiguous layers of the type shown in FIG. 4.

The non-volatile memory cells of FIGS. 3 and 4 and be formed with any suitable processing. An example process for forming the non-volatile memory cell having vertically-stacked charge-trapping layers is described with reference to FIGS. 5-11. In referring to FIGS. 5-11, similar numbering will be used as is utilized above in describing FIG. 3, where appropriate.

Figure 5:
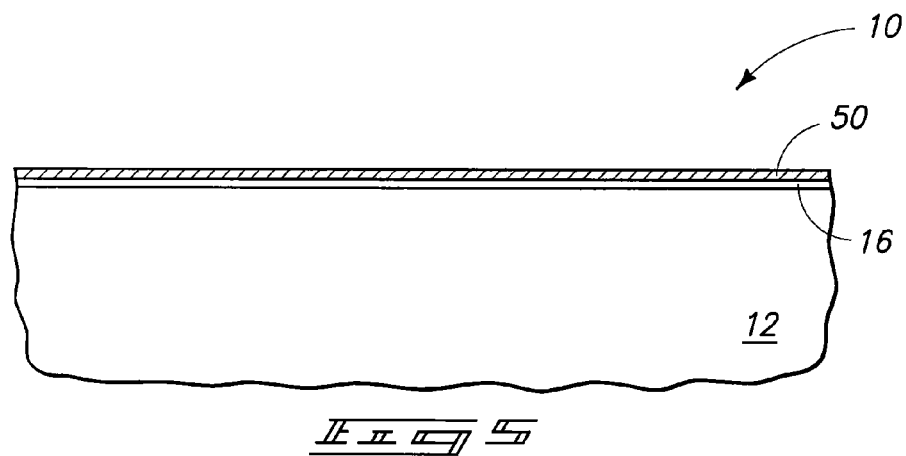
FIGS. 5-11 illustrate various stages of a process for fabricating a memory cell in accordance with an embodiment.

Referring to FIG. 5, construction 10 is shown at a processing stage in which tunnel dielectric material 16 is formed across base 12, and a metal-containing layer 50 is formed over the tunnel dielectric material.

Figure 6:
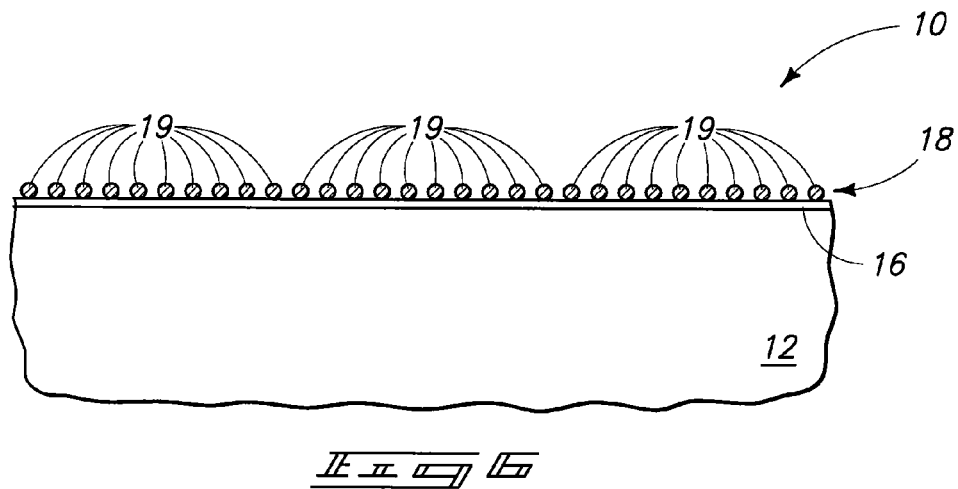

Referring to FIG. 6, the metal-containing layer is subjected to an anneal which breaks the layer into a plurality of discrete islands 19. The islands 19 correspond to the first charge-trapping layer (or zone) 18.

Figure 7:
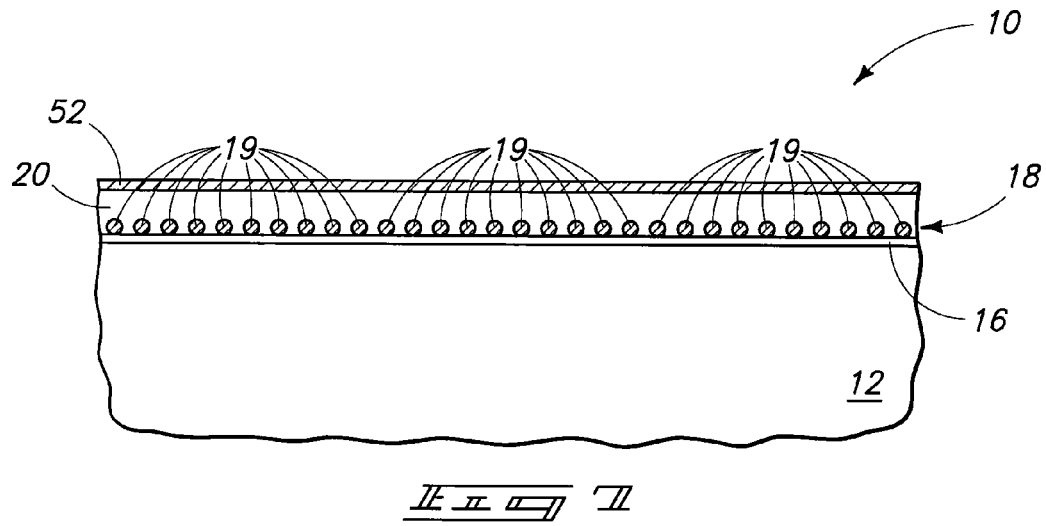

Referring to FIG. 7, dielectric material 20 is formed over and between islands 19, and a metal-containing layer 52 is formed over dielectric material 20.

Figure 8:
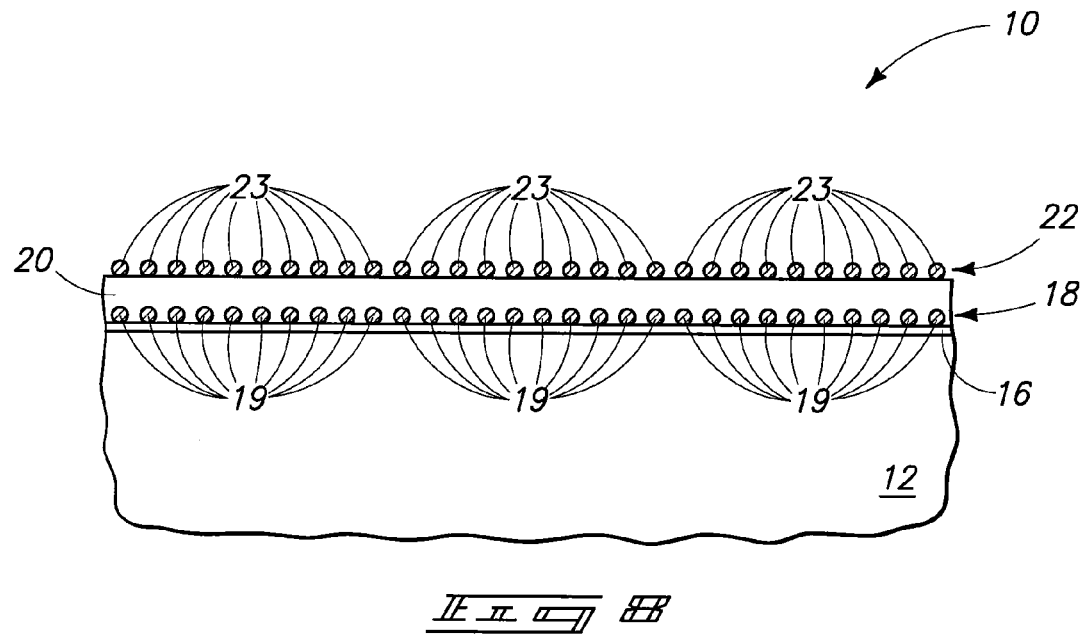

Referring to FIG. 8, metal-containing layer 52 is subjected to an anneal which breaks the layer into discrete islands 23. The islands 23 correspond to second charge-trapping layer (or zone) 22.

Figure 9:
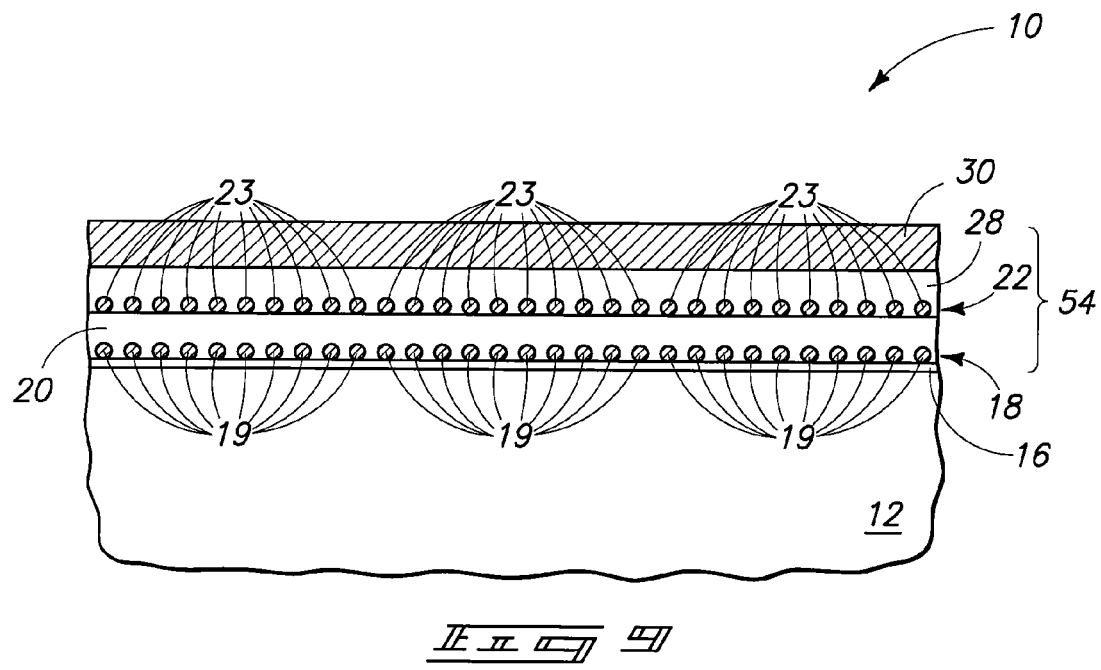

Referring to FIG. 9, blocking dielectric material 28 is formed over and between islands 23, and control gate 30 is formed over the dielectric material. The dielectric materials 16, 20, 28 and 30, together with the control gate and the charge-trapping materials of zones 18 and 22, form a gate stack 54. The gate stack 54 is similar to the gate stack 14 of FIG. 3, but comprises only two charge-trapping zones, instead of the three charge-trapping zones shown in FIG. 3.

Figure 10:
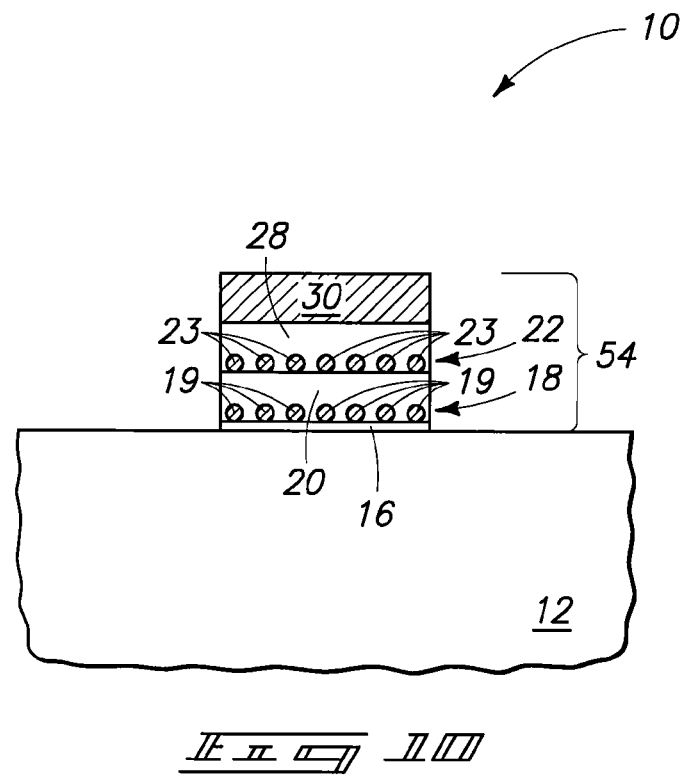

Referring to FIG. 10, gate stack 54 is patterned into a gate. Such patterning may be accomplished by providing a patterned mask (not shown) over the gate stack, transferring a pattern from the mask to the gate stack, and then removing the mask. The mask may comprise, for example, photolithographically patterned photoresist.

Figure 11:
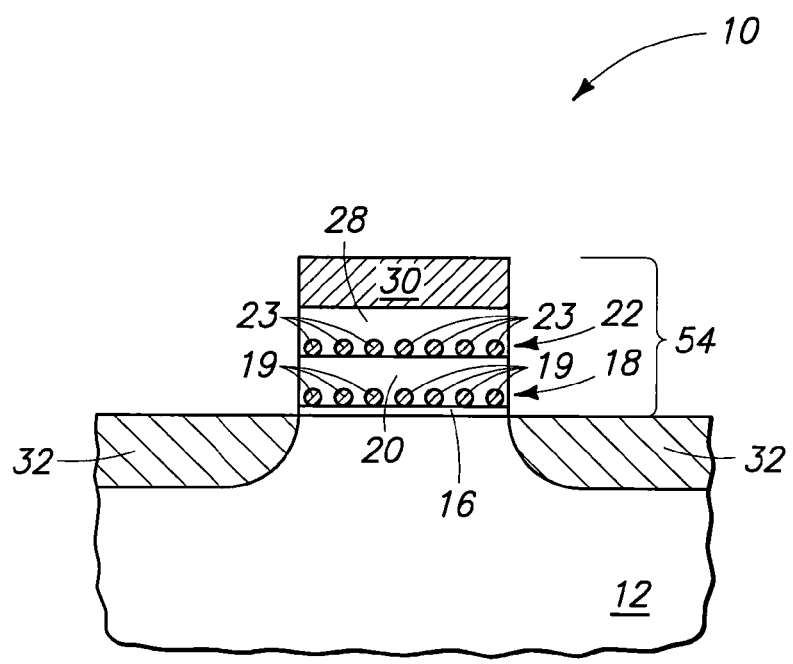

Referring to FIG. 11, source/drain regions 32 are formed on opposing sides of the gate by implanting conductivity-enhancing dopant into base 12.

The methods of forming nanoparticles of FIGS. 5-11 are example methods, and other methods may be used in other embodiments. For instance, the nanoparticles may be formed by deposition of a thin film (specifically, a film of thickness of from about 1 nanometer to about 1.2 nanometers) followed by e-beam evaporation, by co-sputtering metal with embedding insulator, by pulsed nucleation and/or by a templated self-assembly (discussed in more detail below with reference to FIG. 12).

The non-volatile memory cells discussed above may provide numerous advantages relative to conventional non-volatile memory cells. For instance, there may be an enhanced probability of capture of charge provided by the vertically-stacked charge-trapping zones. Specifically, the presence of multiple layers of traps may increase the probability of a carrier trapping event, and thus reduce the probability of ballistic electron ejection through a memory stack. Another advantage may be that the multiple layers of traps may enable a large memory window to be associated with a non-volatile memory cell. This may be enhanced by a reduced electric field in the blocking dielectric for a given threshold voltage (due to vertically distributed charge). Another advantage may be enhanced retention of charge. Specifically, the vertically distributed nature of the trapped charge may enable electric field drop across the tunnel and blocking dielectrics to be reduced during a data retention mode (zero gate bias) which may lead to enhanced data retention. Another advantage may be reduced cell-to-cell sigma variation in threshold voltage relative to conventional non-volatile memory cells. Specifically, threshold voltage may have a dependence on the number of trapping centers, and increasing the total number of trapping centers within individual devices may decrease the statistical relevance of minor variations in the total amount of trapping centers per device. The vertical stacking of trapping centers may increase the total number of traps available for individual memory cells, and thus reduce the statistical sigma in proportion to the total number of traps. The various advantages of vertically-stacked trapping layers may enable NAND flash scaling beyond a 50 nanometer node.

The vertically-stacked trapping layers of the memory cells may be tailored for specific applications. For instance, multiple layers of metallic charge traps may be stacked, with the trap energy of the various layers tuned to meet various desired performance characteristics, such as desired data retention properties, etc. The trapping layer closest to the tunnel dielectric may have the deepest trap energy, and other trapping layers within the vertical stack may have shallower trap energies (with the trap energies being adjusted by choosing different work functions of the various layers).

In some embodiments, one or more of the body dielectric materials may also comprise charge-trapping material (for instance, silicon nitride). Such charge-trapping dielectric material may assist in catching electrons during programming of a memory cell. Such charge-trapping dielectric material may also assist in data retention by reducing electric field between trapping zones and reducing current between various trapping zones.

In some embodiments, an asymmetric dielectric constant between tunneling and blocking dielectric may be realized.

FIG. 12 shows another embodiment of a non-volatile memory cell having vertically-stacked charge-trapping zones. Specifically, FIG. 12 shows a semiconductor construction 100 comprising a non-volatile memory cell 102. The memory cell 102 comprises a gate stack 104 over base 12.

The gate stack 104 comprises a tunnel dielectric material 106, a first charge-trapping zone 108, a body dielectric material 110, a second charge-trapping zone 112, a blocking dielectric material 114, and the control gate 30. The memory cell also comprises the source/drain regions 32.

The first charge-trapping zone 108 comprises nanoparticles 109, and the second charge trapping zone 112 comprises nanoparticles 111. The nanoparticles 109 and 111 may be nanodots, and may be the same in composition, size (specifically, average cross-sectional dimension) and population density as one another, or may differ in one or more of composition, average cross-sectional dimension, or population density. The nanoparticles 109 and 111 may comprise any of the compositions discussed above for nanoparticles of FIG. 3, and accordingly may comprise, consist essentially of, or consist of one or more of Au, Ag, Co, conductively-doped Ge, Ir, Ni, Pd, Pt, Re, Ru, conductively-doped Si, Ta, Te, Ti and W.

Tunnel dielectric 106 may comprise, consist essentially of, or consist of one or more lanthanide oxides, lanthanide silicates and/or lanthanide aluminates, and in a specific embodiment may consist of praseodymium oxide. In some embodiments, lanthanide oxide may be considered to consist essentially of, or consist of one or more lanthanides together with oxygen. In specific embodiments, the tunnel dielectric may comprise, consist essentially of, or consist of Pr and O; Pr, Si and O; or Pr, Al and O. The tunnel dielectric may be formed to an equivalent oxide thickness of from about 2 nanometers to about 5 nanometers.

The lanthanide oxides, lanthanide silicates and lanthanide aluminates may advantageously reduce programming voltage by a factor of at least two relative to conventional tunnel dielectric (specifically, silicon dioxide). Further, the large band gap of lanthanide oxides, lanthanide silicates and lanthanide aluminates may aid in retention of charges stored on the nanoparticles, particularly when multiple charges are stored on individual nanoparticles.

If the tunnel dielectric consists of lanthanide and oxygen, the tunnel dielectric may be formed by atomic layer deposition (ALD) utilizing pulses of ozone, lanthanide-containing precursor (for instance, organic precursor containing Pr, such as, for example, Pr(mmp)) and water vapor. An initial pulse of ozone may be utilized to quench any dangling bonds present on an underlying surface. A high partial pressure of oxygen may be maintained during layer-by-layer build-up of a lanthanide oxide to maintain desired stoichiometry. Intermittent rapid thermal annealing may be conducted during the ALD to a temperature of from about 800° C. to about 1000° C. in a nitrogen/oxygen mixture to avoid incorporation of O—H and Si—H bonds, and to stabilize the lanthanide oxide (for instance $Pr_2O_3$).

Body dielectric 110 may comprise, consist essentially of, or consist of one or more lanthanide oxynitrides, and in a specific embodiment may consist of praseodymium oxynitride. A lanthanide oxynitride may be considered to be a material containing lanthanide, oxygen and nitrogen; and accordingly the body dielectric may alternatively be referred to as comprising, consisting essentially of, or consisting of one or more lanthanides together with oxygen and nitrogen. In a specific embodiment, the body dielectric may comprise, consist essentially of, or consist of Pr, O and N. The body dielectric may have a thickness between the first and second charge trapping zones 108 and 112 of from about 2 nanometers to about 5 nanometers of equivalent oxide thickness.

The lanthanide oxynitrides may have suitable band gaps to aid in charge retention of charges stored on the nanoparticles, particularly when multiple charges are stored on individual nanoparticles. Additionally, lanthanide oxynitride may provide compositional stability for underlying dielectric materials by blocking migration of contaminants during subsequent processing.

The blocking dielectric 114 may comprise any of the compositions discussed above for blocking dielectric 28 of FIGS. 3 and 4. In some embodiments, blocking dielectric 114 may comprise one or more of hafnium oxide (HfO), hafnium silicon oxynitride (HfSiON), zirconium oxide (ZrO), silicon aluminum oxynitride (SiAlON), aluminum hafnium oxynitride (AlHfON), silicon tantalum oxynitride (SiTaON), aluminum tantalum oxynitride (AlTaON), zirconium silicon oxynitride (ZrSiON), lanthanide silicon oxynitride (for instance, LaSiON), and lanthanide aluminum oxynitride (for instance, LaSiON). The chemical formulas are shown to illustrate the elements comprised by the compounds, rather than to illustrate stoichiometric relationships of the elements. The blocking dielectric may be formed to a thickness of from about 30 angstroms equivalent oxide thickness to about 80 angstroms equivalent oxide thickness.

An advantage of utilizing the oxynitride-containing compounds in the blocking dielectric may be that such compounds can prevent migration of dopant or contaminants that may be present in control gate 116. Such can prevent the dopant or contaminants from reaching materials underlying the blocking dielectric. In some embodiments, metal nitride passivation layers (discussed above with reference to control gate 30 FIG. 3) may be omitted from the control gate 116 if oxynitride-containing compounds are utilized in the blocking dielectric.

Although the charge-trapping zones 108 and 112 are both shown to comprise nanoparticles, in other embodiments one or both of the charge-trapping zones may comprise a continuous layer (such as, for example, the continuous layers described above with reference to FIG. 4).

In embodiments in which the charge-trapping zones 108 and 112 comprise nanoparticles, such nanoparticles may be formed with any suitable processing. In some embodiments, methods of self-assembly of the nanoparticles may be utilized in order to obtain uniform distribution, size and separations of the nanoparticles. The self-assembly may comprise formation of diblock copolymer of polystyrene (PS) and poly(methyl methacrylate) (PMMA) followed by annealing to create PMMA cylinders in a PS matrix. The PMMA may be removed, leaving PS over underlying material. The underlying material may be etched to form a hard mask, and subsequently a thin film of nanoparticle material (for instance, platinum) may be formed over the hard mask and within the openings. If the hard mask comprises a desired material of the body dielectric, excess nanoparticle material may be removed from between the openings to leave the nanoparticles within the openings in the body dielectric material. If the hard mask comprises a material other than the desired body dielectric material, another step may be incorporated to selectively remove such other material relative to the nanoparticles, and to then replace it with the desired body dielectric material.

Other methods for forming self-assembled periodic openings may be utilized in addition to, or alternatively to, the PMMA/PS method. For instance, a surface may be first treated with phenyltriethoxysilane (PTS) to form a self-assembled monolayer, and then a chaperonin protein solution may be applied to form a set of ordered protein cylinders on top of the PTS. The donut-shaped self-assembled protein can then act as templates for selective etching into the underlying material to form a periodic pattern of openings within the underlying material. Such openings may then be used for subsequent fabrication of the nanoparticles.

Another method is to form a self-assembled polymeric template directly on a lanthanide oxide tunnel dielectric, ion implant exposed templated surfaces of the insulator with argon to enhance and create nucleation centers, remove the self-assembled polymer, and then co-deposit nanodot material (for instance, platinum) and body-dielectric material (for instance, praseodymium oxynitride) by sputtering. A subsequent anneal may be conducted to stabilize the structure.

FIG. 13 shows a band gap diagram of a specific embodiment of the memory cell of FIG. 12. The embodiment of FIG. 13 utilizes tunnel dielectric 106 of PrO (shown in terms of the elemental components, rather than in terms of a specific stoichiometry), body dielectric 110 of PrON (shown in terms of the elemental components, rather than in terms of a specific stoichiometry), and blocking dielectric 114 of HfSiON (shown in terms of the elemental components, rather than in terms of a specific stoichiometry). Various example energy levels and transitions are shown in FIG. 13 in electron volts (eV). The incorporation of PrO as tunnel dielectric may provide very low leakage, which may improve charge retention by many orders of magnitude.

Figure 14:
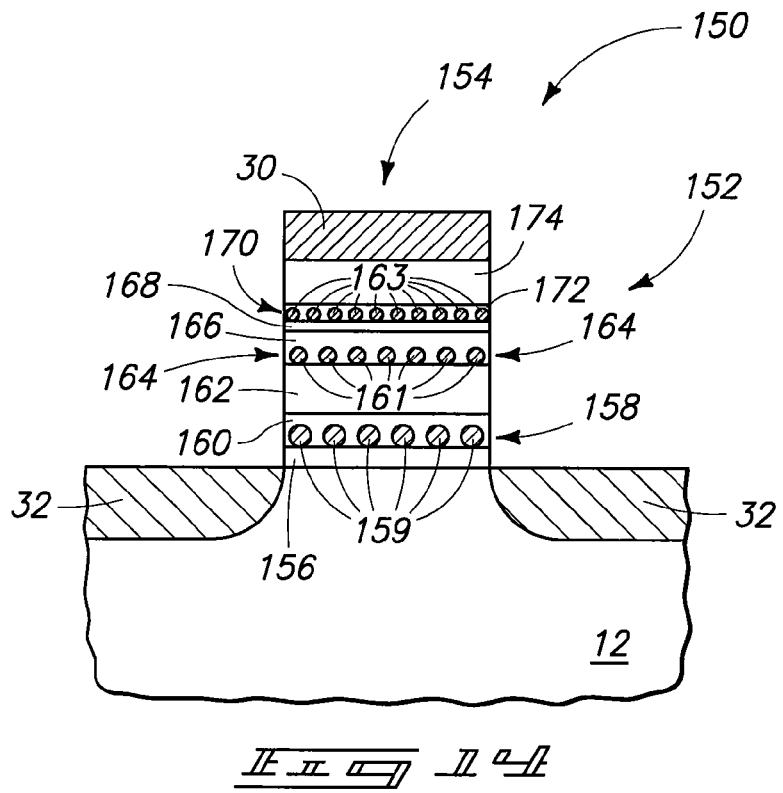
FIG. 14 is a diagrammatic cross-sectional view of a portion of a semiconductor wafer illustrating another embodiment of a memory cell.

FIG. 14 shows another embodiment of a non-volatile memory cell having vertically-stacked charge-trapping zones. Specifically, FIG. 14 shows a semiconductor construction 150 comprising a non-volatile memory cell 152. The memory cell 152 comprises a gate stack 154 over base 12.

The gate stack 154 comprises a tunnel dielectric material 156, a first charge-trapping zone 158 embedded within a retaining material 160, a spacer material 162, a second charge-trapping zone 164 embedded within a retaining material 166, a spacer material 168, a third charge-trapping zone 170 embedded within a retaining material 172, a blocking dielectric material 174, and the control gate 30. The memory cell also comprises the source/drain regions 32.

The first charge-trapping zone 158 comprises nanodots 159, the second charge trapping zone 164 comprises nanodots 161, and the third charge trapping zone 170 comprises nanodots 163. The nanodots 159, 161 and 163 may be the same in composition as one another, or may differ in composition. In some embodiments, the nanodots 159, 161 and 163 may comprise, consist essentially of, or consist of one or more of Au, Ag, Co, conductively-doped Ge, Ir, Ni, Pd, Pt, Re, Ru, conductively-doped Si, Ta, Te, Ti and W.

The nanodots within the charge-trapping zones further from the tunnel dielectric are smaller than those within the charge-trapping zones closer to the tunnel dielectric. Specifically, the average cross-sectional dimension of the population of the nanodots 159 is larger than that of the population of the nanodots 161, which in turn is larger than that of the population of the nanodots 163. In some embodiments, the average cross-sectional dimension of the nanodots may decrease by at least about 10 percent in progressing from one charge-trapping zone to the charge trapping zone above it. Thus, the population of nanodots 163 may have an average cross-sectional dimension that is at least about 10 percent smaller the population of nanodots 161, which in turn may have an average cross-sectional dimension that is at least about 10 percent smaller than the population of nanodots 159. In some embodiments, the population densities of the nanodots 159, 161 and 163 may differ relative to one another by at least 10%.

Trapping energy associated with individual nanodots, the amount of charge retained on individual nanodots, and the charge storage density of a plane of nanodots, may be related to the size and the composition of the nanodots. Specifically, smaller nanodots have shallower charge traps than larger nanodots, and retain less charge; and yet smaller nanodots provide higher planar charge density if spaced at the same distance as the larger nanodots. The changes in trap depth and amount of retained charge may result from quantum confinement and coulomb blockade, at least when the nanodots have a diameter of from about 1 nanometer to about 10 nanometers.

Quantum confinement describes how the electronic properties—the organization of energy levels into which electrons can climb or fall—change when a nanoparticle is sufficiently small in size. This size is typically 10 nanometers (nm) or less. Specifically, the phenomenon results from electrons and holes being squeezed into a dimension that approaches a critical quantum measurement, called the "exciton Bohr radius." The larger the particle size, the lower the ground state and, therefore, the longer the charge can be retained. The smaller the particle size, the more easily the electron stays in a shallow energy level so that it can come out more readily.

Coulomb blockade is the suppression of current, at low bias, due to the opposing electrostatic field created by the presence of an elementary charge. A nanoparticle becomes a charge center when it attracts a charge. A nanoparticle can capture multiple electrons. However, every time an electron is captured, the electrostatic field around the nanoparticle builds up to the point where it repels other electrons, thereby inhibiting transport and storage of electrons. Thus, additional incoming electrons come with a higher energy state, and consequently may leak out. Therefore, the more electrons that are captured by a nanodot, the lower the charge retention time of some of the electrons.

The individual nanodots in the charge-trapping zones 158, 164 and 170 may be spaced from one another by at least about 3.5 nanometers to avoid cross-talk between adjacent nanodots. If the spacing between adjacent nanodots is about the same within the various charge-trapping zones, then the zones with the smaller nanodots will have a higher population density of nanodots than the zones with the larger nanodots.

By placing increasingly smaller nanodots within the charge-trapping zones as the charge-trapping zones are further from the tunnel dielectric, the trapping characteristics of the various charge-trapping zones may be matched to one another. Specifically, if the zones further from the tunnel dielectric have the same trapping energy as the zones closer to the tunnel dielectric, then the zones further from the tunnel dielectric are more difficult to discharge than are the zones closer to the tunnel dielectric due to the additional distance that electrons or holes must travel to reach the further zones. However, by lowering the trapping energy of the zones further from the tunnel dielectric, such zones can now be discharged with energy comparable to that utilized to discharge from the zones closer to the tunnel dielectric. Accordingly, the closer charge-trapping zones and further charge-trapping zones can then be programmed and erased with similar energy. The closer charge-trapping zones and further charge-trapping zones thus operate together during program and erase operations to trap charge. Such may improve uniformity of program voltage across multiple memory cells by providing a large number of traps within each memory cell so that cell-to-cell variation of a few charge traps is less significant to the overall performance of individual cells. The improvement of uniformity across multiple memory cell devices may be referred to as a reduction in dispersion of charge storage states across the devices. The utilization of the closer charge-trapping zones and further charge-trapping zones as a single entity during programming and erasing may also increase the memory window of individual memory cells.

The change in trapping energy of the further charge-trapping zones relative to the charge-trapping zones nearer the tunnel dielectric may be enhanced by utilizing lower work function materials for the nanodots of the further charge-trapping zones relative to the materials utilized for the nanodots of the charge-trapping zones nearer the tunnel dielectric.

The matching of the trapping energy of the zones further from the tunnel dielectric to the zones closer to the tunnel dielectric may be enhanced by the materials that the nanodots are embedded in, and by the spacing materials provided between the trapping zones. For instance, the spacing materials that are further from the tunnel dielectric may be formed to be more pervious to electrons and/or holes than are the spacing materials that are closer to the tunnel dielectric. The change in perviousness may be accomplished by changing one or both of the composition and thickness of the materials as the materials are more distant from the tunnel dielectric.

Example materials and thicknesses that may be utilized in the gate stack 154 of FIG. 14 are as follows. The tunnel dielectric 156 may consist of silicon dioxide formed to a thickness of from about 3 nanometers to about 7 nanometers, and may be from about 3 nanometers to about 3.5 nanometers. The nanodots 159 may consist of platinum or ruthenium, and may be spheres having a diameter such that the trapping energy is about 5 eV. The material 160 within which nanodots 159 are embedded and material 162 may both consist of silicon dioxide, and may be formed to a total thickness over the uppermost surfaces of nanodots 159 of from about 2 nanometers to about 2.5 nanometers. The nanodots 161 may consist of tungsten, and may be spheres having a diameter such that the trapping energy is about 4.5 eV. The material 166 within which nanodots 161 are embedded and material 168 may both consist of silicon oxynitride, and may be formed to a total thickness over the uppermost surfaces of nanodots 161 of about 2 nanometers. The nanodots 163 may consist of Au, conductively-doped Ge or conductively-doped Si, and may be spheres having a diameter such that the trapping energy is about 4 eV. The material 172 within which nanodots 163 are embedded, and the charge blocking material 174 may consist of aluminum oxide, and may have a thickness of 18 nanometers (in other words, an equivalent oxide thickness of about 8 nanometers) over the nanodots 163.

The trapping energy may be influenced by nanoparticle size; and/or by a relationship of a dielectric barrier to nanoparticle material work function. Accordingly, the trap depth may be tuned by tailoring nanoparticle size; and/or by tuning the nanoparticle material/dielectric material combination.

The utilization of silicon oxynitride for materials 166 and 168 may enhance trapping of charge, in that silicon oxynitride is itself a charge-trapping material.

The specific materials discussed above are example materials for the nanodots and layers of the embodiment of FIG. 14. In other embodiments, other materials may be used additionally, or alternatively, to the specific materials described. For instance, any of the spacing materials discussed above relative to FIGS. 1-13 may be used for one or more of the materials 160, 162, 166, 168 and 172; any of the tunnel dielectric materials discussed above relative to FIGS. 1-13 may be used for tunnel dielectric 156, any of the charge blocking materials discussed above relative to FIGS. 1-13 may be used for the charge blocking material 174, and any of the nanodot materials discussed above relative to FIGS. 1-13 may be used for the nanodots 159, 161 and 163.

Figure 15:
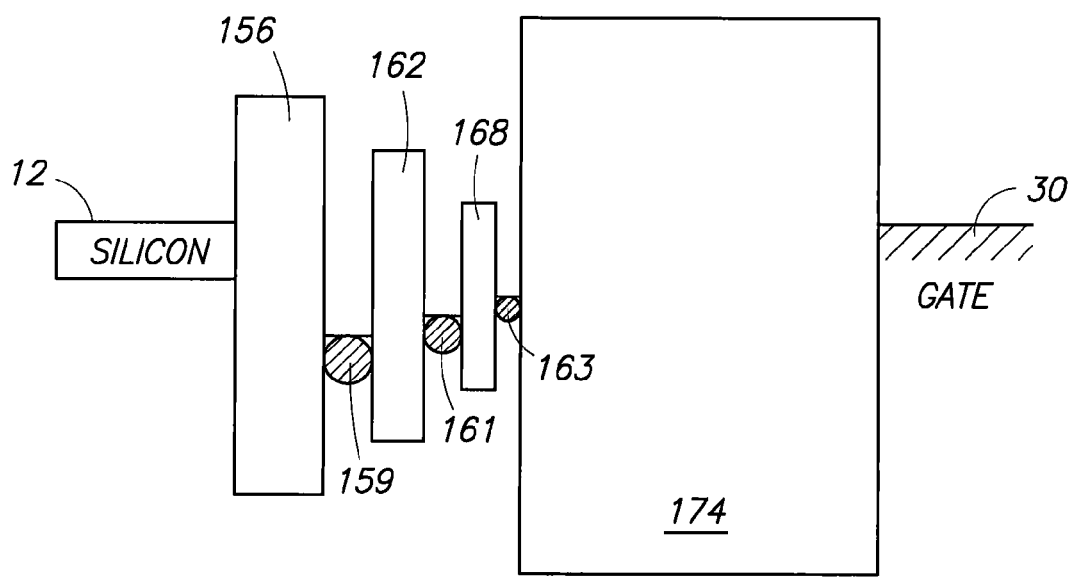
FIG. 15 is an energy band diagram of an example of the embodiment of FIG. 14.

FIG. 15 shows a band gap diagram of an example of the memory cell embodiment of FIG. 14.

The memory cells discussed above in FIGS. 1-15 may be incorporated into memory arrays, and such arrays may be utilized as flash memory in various electronic systems, such as computer systems, cameras, phones, cars, clocks, etc.

Figure 16:
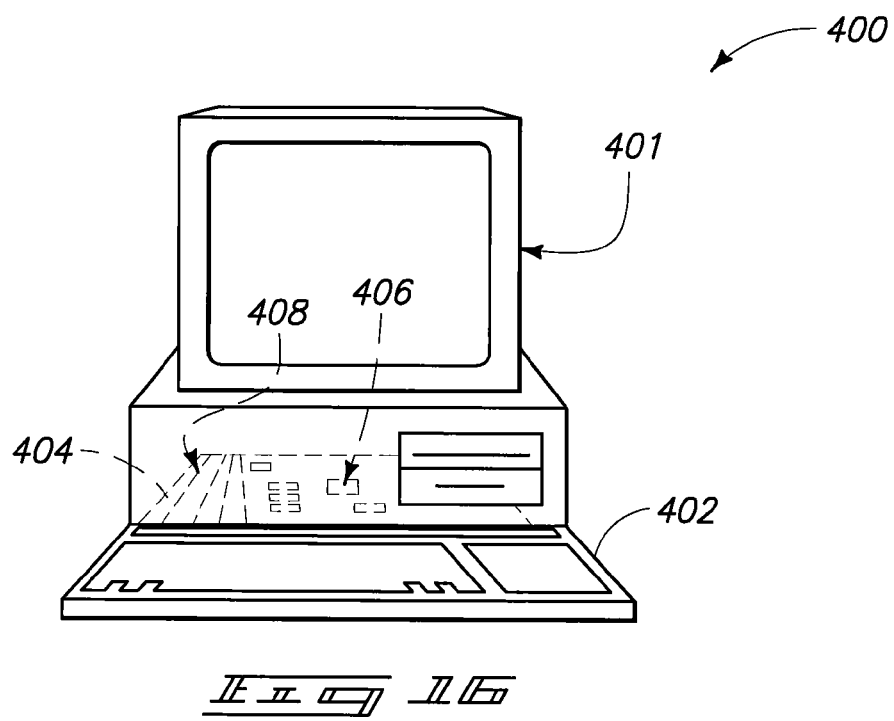
FIG. 16 is a diagrammatic view of a computer embodiment.
Figure 17:
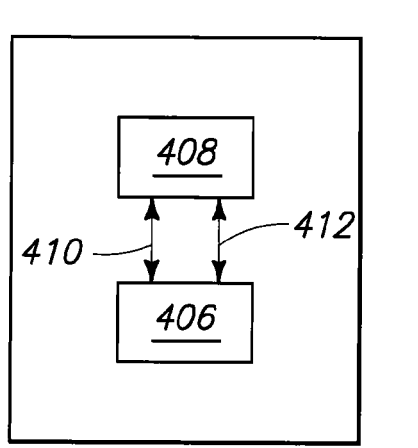
FIG. 17 is a block diagram showing particular features of the motherboard of the FIG. 16 computer embodiment.

FIG. 16 illustrates an embodiment of a computer system 400. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 17. In such block diagram, the addressing circuitry is illustrated as 410 and the read circuitry is illustrated as 412.

Processor device 406 can correspond to a processor module, and associated memory utilized with the module can comprise flash structures.

Memory device 408 can correspond to a memory module, and can comprise flash memory.

Figure 18:
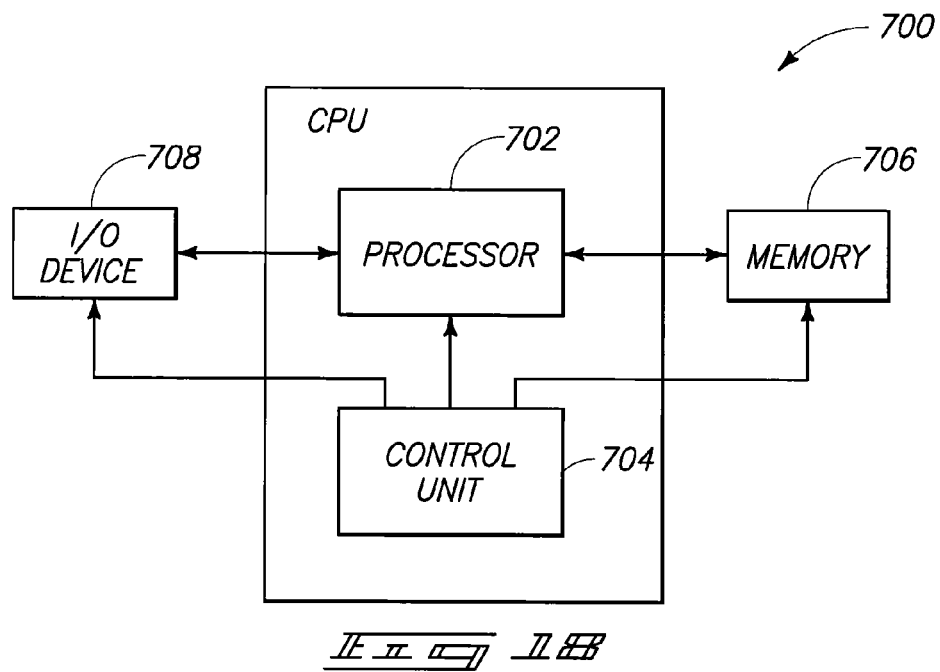
FIG. 18 is a high zone block diagram of an electronic system embodiment.

FIG. 18 illustrates a simplified block diagram of a high-zone organization of an electronic system 700. System 700 can correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system can have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 can include flash memory, such as a flash card.

Figure 19:
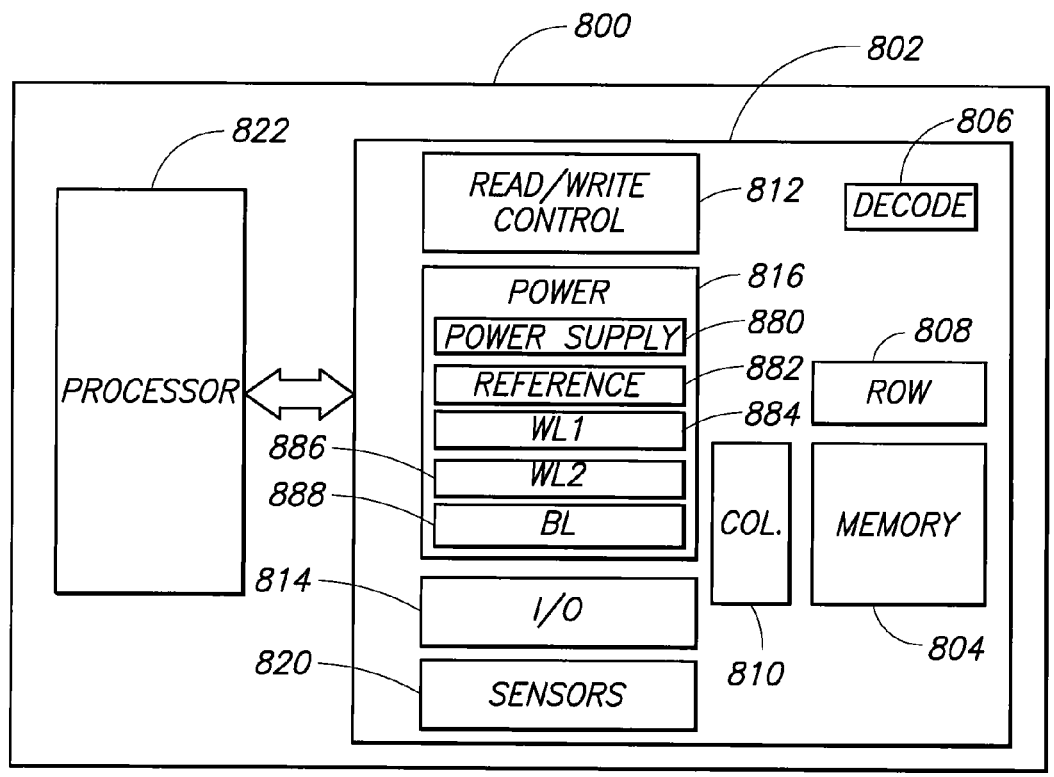
FIG. 19 is a simplified block diagram of a memory device embodiment.

FIG. 19 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 can include flash memory.

The various electronic systems can be fabricated in single-package processing units, or even on a single semiconductor chip, in order to reduce the communication time between the processor and the memory device(s).

The electronic systems can be used in memory modules, device drivers, power modules, communication modems, processor modules, and application-specific modules, and may include multilayer, multichip modules.

The electronic systems can be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell comprising a pair of charge-trapping zones spaced from one another by a region comprising at least one dielectric material that contains a lanthanide, oxygen and nitrogen;
    wherein both of the charge-trapping zones of said pair comprise a plurality of nanodots;
    wherein the nanodots of one of the charge-trapping zones have a first population density; and
    wherein the nanodots of the other of the charge-trapping zones have a second population density that is at least 10% different than the first population density.

2. A memory cell comprising a pair of charge-trapping zones spaced from one another by a region comprising at least one dielectric material that contains a lanthanide, oxygen and nitrogen;
    wherein both of the charge-trapping zones of said pair comprise a plurality of nanodots;
    wherein all of the nanodots of one of the charge-trapping zones form a first population having a first average cross-sectional dimension;

wherein all of the nanodots of the other of the charge-trapping zones form a second population having a second average cross-sectional dimension;

wherein the first average cross-sectional dimension is at least 10% different than the second average cross-sectional dimension;

wherein the charge trapping zones are vertically stacked relative to one another, with one of the charge trapping zones being a lower charge trapping zone and the other being an upper charge trapping zone;

wherein the memory cell further comprises tunnel dielectric between the lower charge trapping zone and an underlying semiconductor substrate; and wherein the nanodot population of the upper charge-trapping zone has a smaller average cross-sectional dimension than the nanodot population of the lower charge trapping zone.

3. A memory cell comprising:

a tunnel dielectric;

a first nanodot zone over the tunnel dielectric, the nanodots of the first nanodot zone having a first population density;

a second nanodot zone over the first nanodot zone, the nanodots of the second nanodot zone having a second population density that is at least about 10% different from the first population density;

at least one spacing material between the first and second nanodot zones; and a control gate over the second nanodot zone.

4. A memory cell comprising:

a tunnel dielectric;

a first nanodot zone over the tunnel dielectric, the nanodots of the first nanodot zone having a first average cross-sectional dimension;

a second nanodot zone over the first nanodot zone, the nanodots of the second nanodot zone having a second average cross-sectional dimension that is at least about 10% different from the first average cross-sectional dimension;

at least one spacing material between the first and second nanodot zones;

a control gate over the second nanodot zone; and wherein the second average cross-sectional dimension is less than the first average cross-sectional dimension.

5. A memory cell comprising:

a tunnel dielectric;

a first nanodot zone over the tunnel dielectric, the nanodots of the first nanodot zone having a first average cross-sectional dimension;

a second nanodot zone over the first nanodot zone, the nanodots of the second nanodot zone having a second average cross-sectional dimension that is at least about 10% different from the first average cross-sectional dimension;

at least one spacing material between the first and second nanodot zones;

a control gate over the second nanodot zone; and one or more additional nanodot zones over the second nanodot zone.

6. The memory cell of claim 5 wherein one of said one or more additional nanodot zones is a third nanodot zone, and wherein the first, second and third nanodot zones differ from one another in trap depth.

7. The memory cell of claim 5 comprising a total number of nanodot zones of from 3 to 5.

8. An electronic system, comprising:

a processor; and memory in data communication with the processor, the memory comprising a plurality of memory cells; at least some of the individual memory cells comprising:

tunnel dielectric;

a first charge-trapping zone over the tunnel dielectric;

a spacing dielectric material over the first charge-trapping zone;

a second charge-trapping zone over the spacing dielectric material;

a blocking dielectric over the second charge-trapping zone;

a control gate over the blocking dielectric;

wherein the first and second charge trapping zones comprise first and second nanoparticles, respectively; and wherein the first and second nanoparticles form first and second populations, respectively, that differ from one another in population density.

9. The electronic system of claim 8 wherein the blocking dielectric comprises one or both of hafnium oxide and zirconium oxide.

10. The electronic system of claim 8 wherein the blocking dielectric comprises one or more of hafnium silicon oxynitride, zirconium silicon oxynitride, zirconium aluminate, silicon dioxide, silicon aluminum oxynitride, aluminum hafnium oxynitride, silicon tantalum oxynitride, and aluminum tantalum oxynitride.

11. The electronic system of claim 8 wherein said at least some of the individual memory cells comprise at least one more charge-trapping zone in addition to the first and second zones.

12. The electronic system of claim 8 wherein said at least some of the individual memory cells comprise at least one more charge-trapping zone in addition to the first and second zones; and wherein all of the charge-trapping zones are spaced from one another by intervening layers of spacing dielectric material that contains one or more lanthanide oxynitrides.

13. The electronic system of claim 12 wherein said at least some of the individual memory cells comprise a total number of charge-trapping zones of from 3 to 5.

14. The electronic system of claim 8 wherein:

said at least some of the individual memory cells comprise a third charge-trapping zone in addition to the first and second zones;

the third charge trapping zone is over the second charge trapping zone; and the first, second and third charge-trapping zones differ from one another in trap depth; with the first charge-trapping zone having the deepest trap depth, the third charge-trapping zone having the shallowest trap depth, and the second charge-trapping zone having a trap depth intermediate that of the first charge-trapping zone and that of the third charge-trapping zone.

* * * * *